United States Patent
Nakata

(10) Patent No.: US 9,973,197 B2
(45) Date of Patent: May 15, 2018

(54) PHASE-LOCKED LOOP CIRCUIT

(71) Applicant: TOSHIBA MEMORY CORPORATION, Minato-ku (JP)

(72) Inventor: Masashi Nakata, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days. days.

(21) Appl. No.: 15/428,287

(22) Filed: Feb. 9, 2017

(65) Prior Publication Data
US 2018/0069555 A1 Mar. 8, 2018

Related U.S. Application Data

(60) Provisional application No. 62/384,513, filed on Sep. 7, 2016.

(51) Int. Cl.
H03L 7/06 (2006.01)
H03L 7/089 (2006.01)

(52) U.S. Cl.
CPC .................. *H03L 7/0893* (2013.01)

(58) Field of Classification Search
USPC .................. 327/147–149, 156–158
See application file for complete search history.

(56) References Cited

U.S. PATENT DOCUMENTS

| | | | | |
|---|---|---|---|---|
| 7,982,510 B2 * | 7/2011 | Casagrande | ......... | H03C 3/0925 327/148 |
| 9,812,211 B2 * | 11/2017 | Tanaka | ................... | G11C 16/26 |
| 2004/0239386 A1 * | 12/2004 | Lim | ...................... | H03L 7/0893 327/156 |
| 2006/0028255 A1 * | 2/2006 | Kimura | .................... | H03L 7/087 327/157 |
| 2006/0267644 A1 * | 11/2006 | Youssoufian | ......... | H03L 7/0893 327/156 |
| 2007/0001723 A1 * | 1/2007 | Lin | ...................... | H03L 7/0893 327/156 |
| 2007/0229127 A1 * | 10/2007 | Tirumalai | ............. | H03L 7/0893 327/156 |
| 2008/0042759 A1 | 2/2008 | Watanabe | | |
| 2008/0061850 A1 * | 3/2008 | Watanabe | ............. | H03L 7/0893 327/157 |
| 2010/0271141 A1 | 10/2010 | Hirai | | |

(Continued)

FOREIGN PATENT DOCUMENTS

| | | |
|---|---|---|
| JP | 11-122100 | 4/1999 |
| JP | 2008-48320 | 2/2008 |

(Continued)

*Primary Examiner* — Adam Houston
(74) *Attorney, Agent, or Firm* — Oblon, McClelland, Maier & Neustadt, L.L.P.

(57) ABSTRACT

The phase-locked loop circuit according to one embodiment includes a low-pass filter including a first transistor, and a second transistor. The low-pass filter converts a first current into a first voltage, and a second current into a second voltage. The first current and the second current are generated in accordance with a pulse width of the same signal. The first transistor includes a gate input with the first voltage, a first terminal grounded, a second terminal electrically coupled to a gate of the second transistor, and a gate oxide film thicker than that of the second transistor. The second transistor includes the gate input with the second voltage.

14 Claims, 10 Drawing Sheets

(56) References Cited

U.S. PATENT DOCUMENTS

| | | | |
|---|---|---|---|
| 2011/0063969 A1* | 3/2011 | Kawamoto | H03L 7/0893 369/126 |
| 2013/0154697 A1* | 6/2013 | Katsushima | H03L 7/06 327/157 |
| 2014/0266343 A1* | 9/2014 | Song | H03L 7/0802 327/157 |
| 2015/0004919 A1* | 1/2015 | Ek | H03L 7/087 455/75 |
| 2015/0214966 A1* | 7/2015 | Tong | H03L 7/0898 327/157 |
| 2016/0006442 A1* | 1/2016 | Lahiri | H03L 7/093 327/157 |
| 2016/0020773 A1* | 1/2016 | Yu | H02M 3/07 331/35 |

FOREIGN PATENT DOCUMENTS

| | | |
|---|---|---|
| JP | 2010-273320 | 12/2010 |
| JP | 2013-126146 | 6/2013 |

* cited by examiner

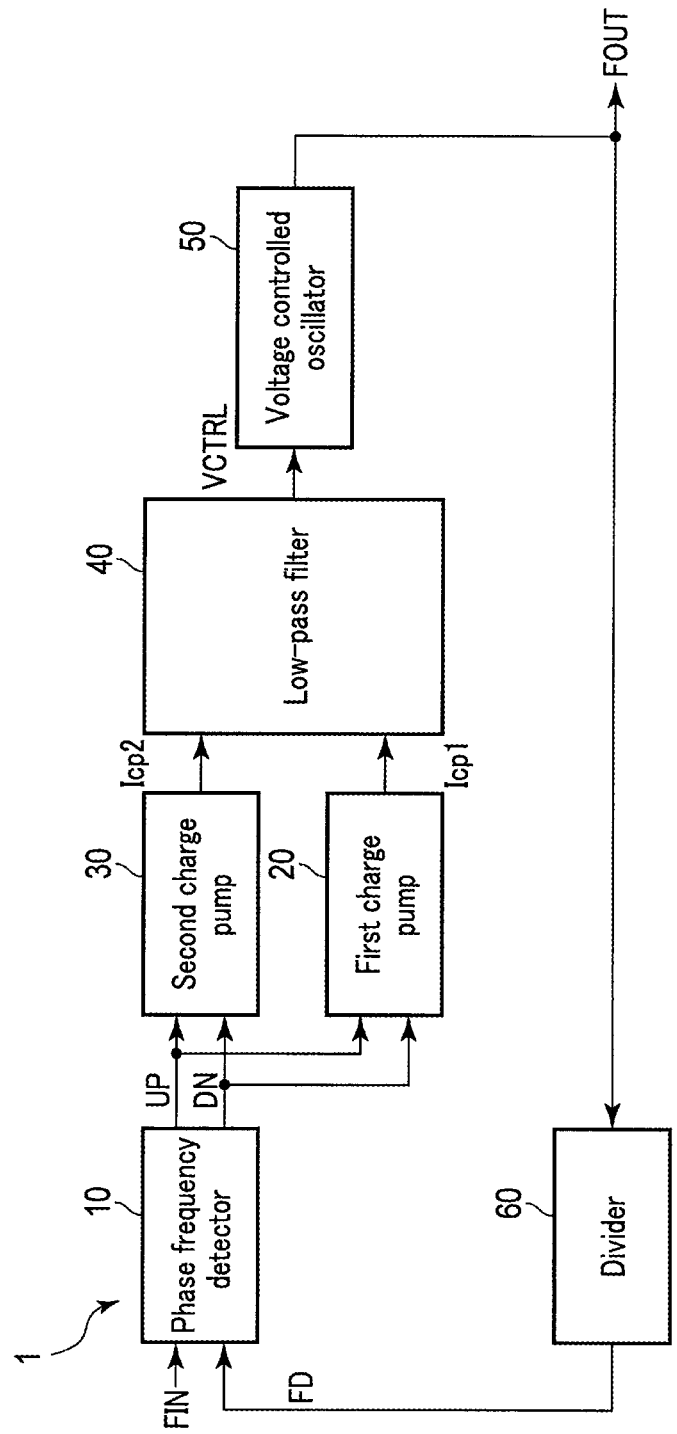
F I G. 1

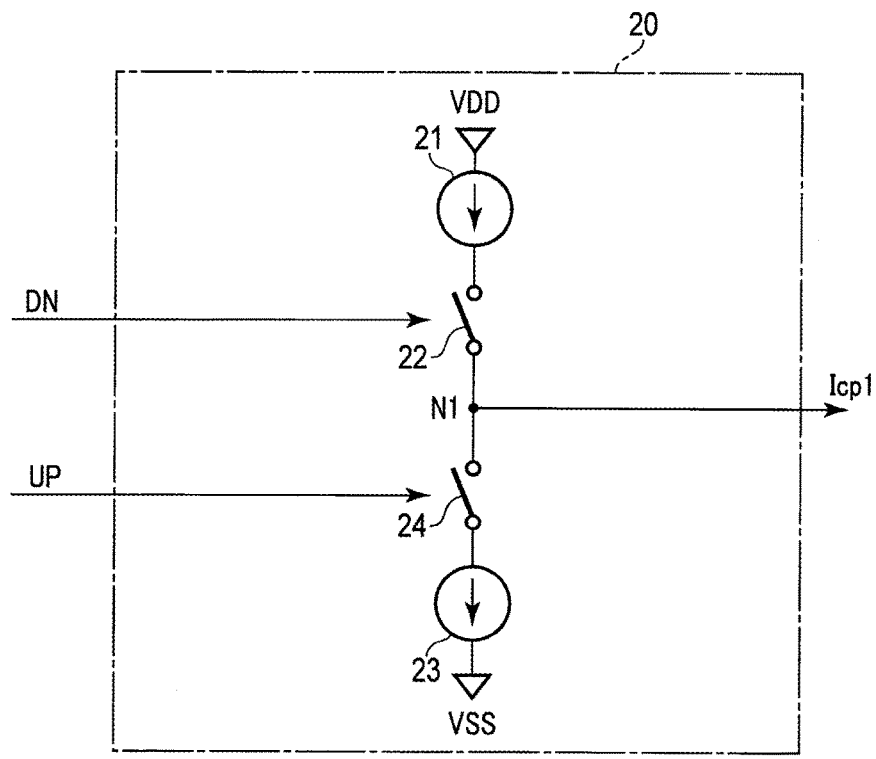
F I G. 2
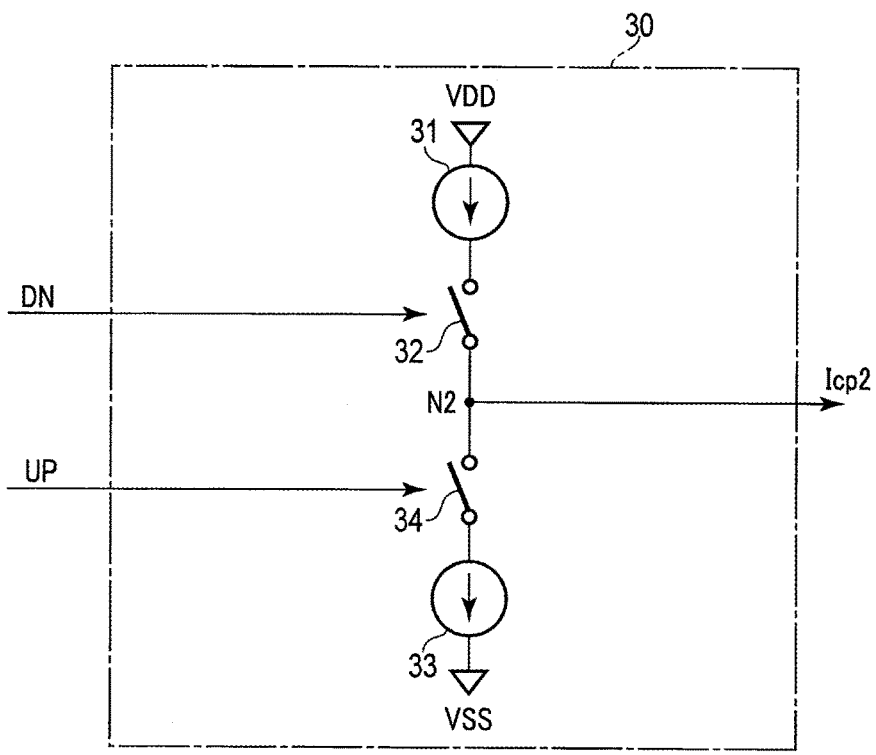
F I G. 3

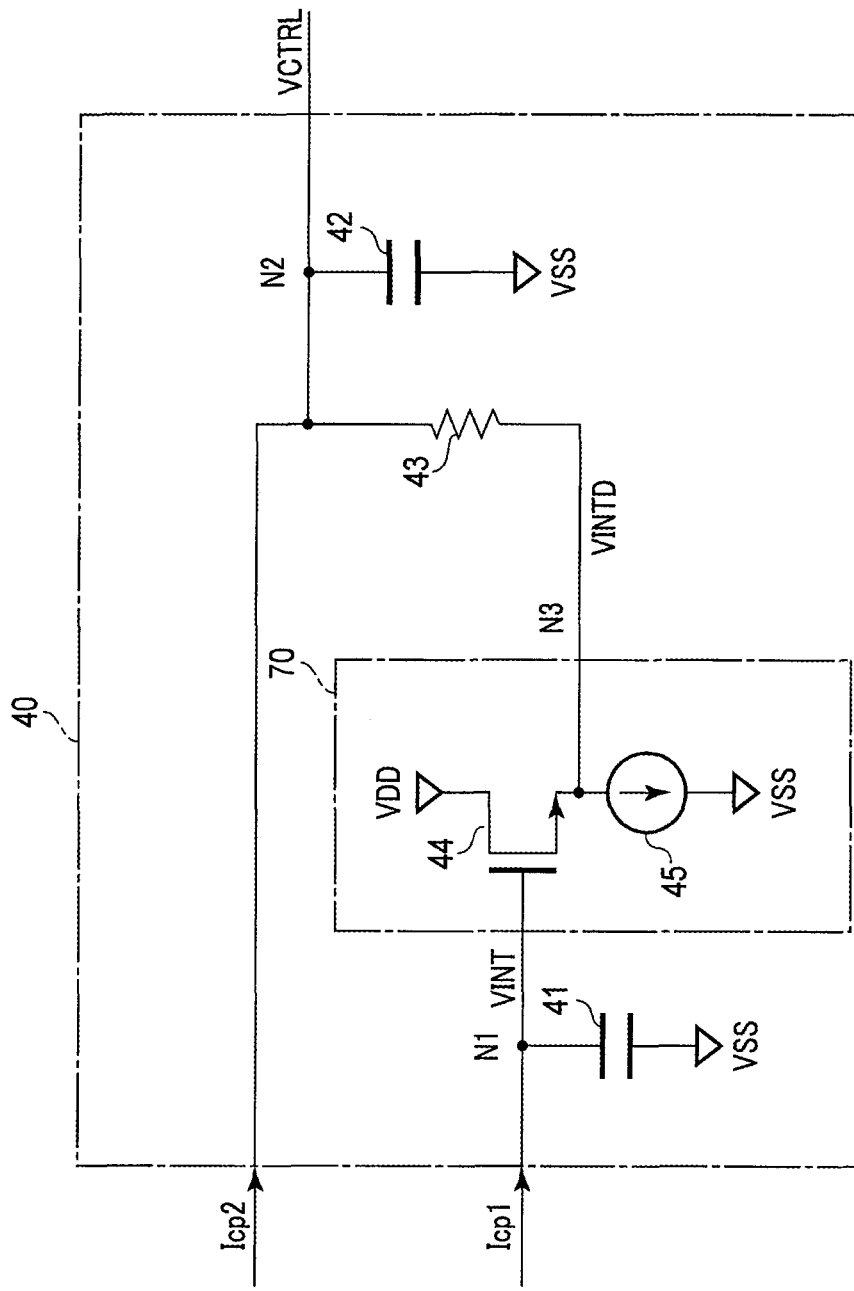
F I G. 4

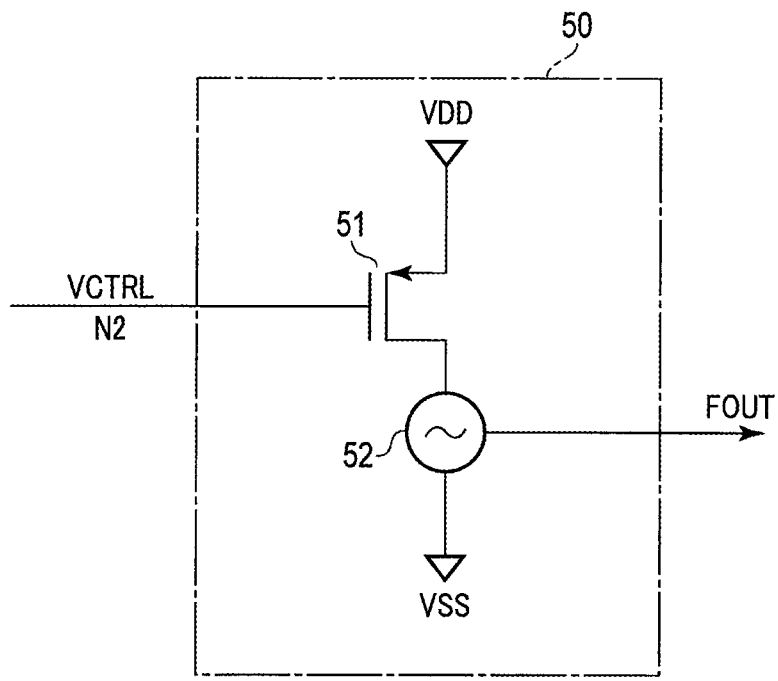
F I G. 5
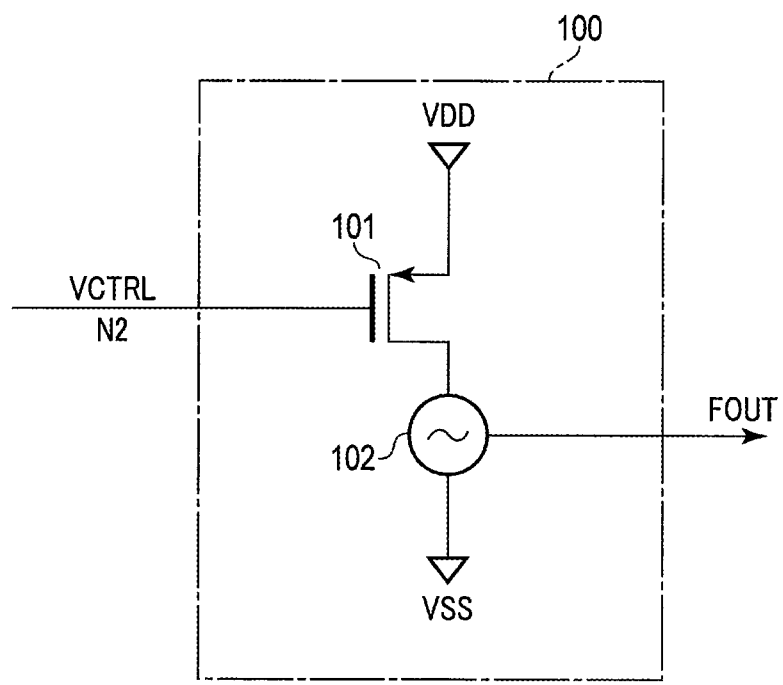
F I G. 6

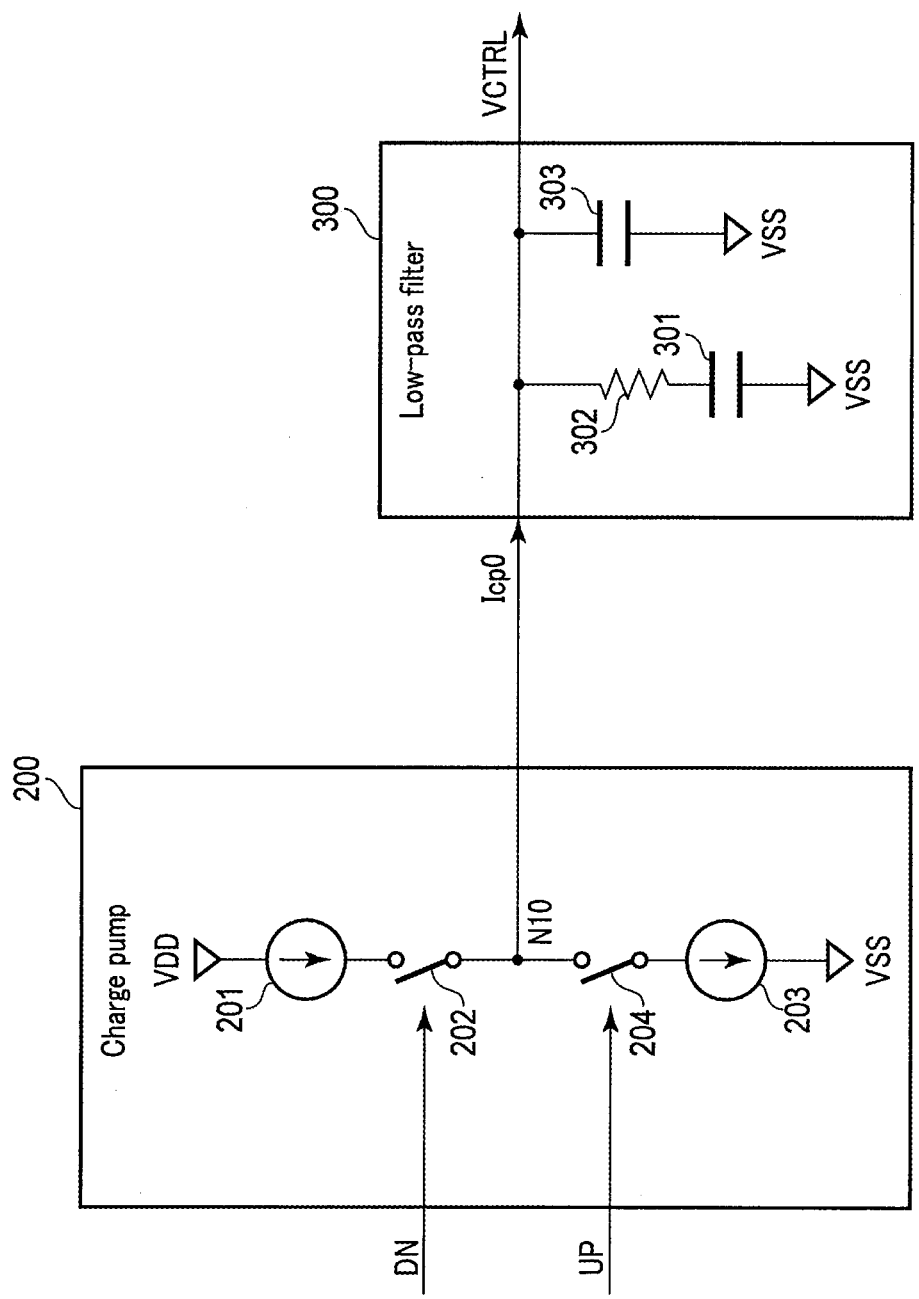
F I G. 9

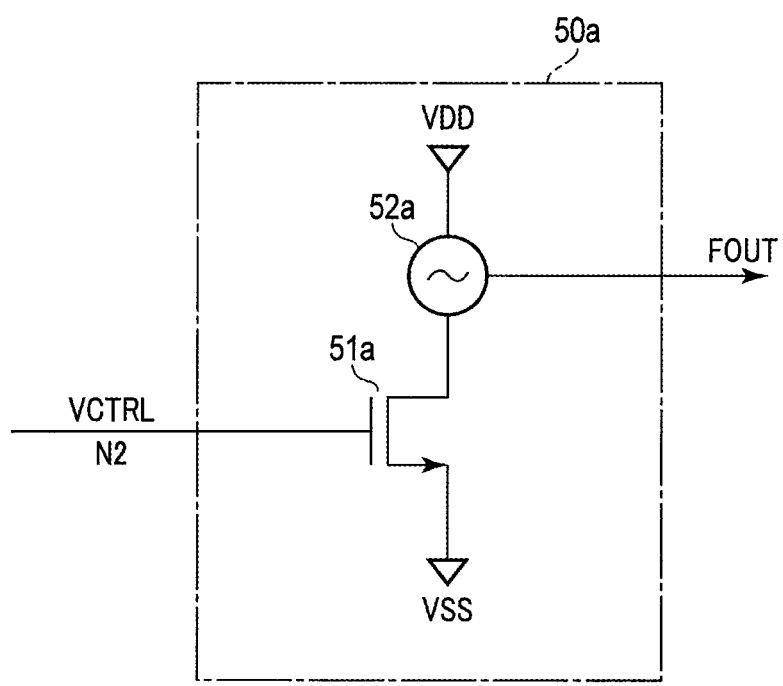
F I G. 11

PHASE-LOCKED LOOP CIRCUIT

CROSS-REFERENCE TO RELATED APPLICATIONS

This application claims the benefit of U.S. Provisional Application No. 62/384,513, filed Sep. 7, 2016, the entire contents of which are incorporated herein by reference.

FIELD

Embodiments described herein relate generally to a phase-locked loop circuit.

BACKGROUND

A phase-locked loop circuit is known as a circuit for generating a signal that is synchronized with a reference clock.

A phase-locked loop circuit, for example, compares a phase frequency of an input signal with a phase frequency of an output signal, and generates a voltage of a magnitude corresponding to a difference between the phase frequencies. The phase-locked loop circuit generates, as an output signal, a signal having a frequency corresponding to a magnitude of the generated voltage. The output signal is fed back to be compared with the input signal, and a frequency of the output signal is controlled in accordance with a frequency of the input signal.

BRIEF DESCRIPTION OF THE DRAWINGS

FIG. 1 is a circuit diagram showing a configuration of a phase-locked loop circuit according to an embodiment.

FIG. 2 is a circuit diagram showing a configuration of a first charge pump of the phase-locked loop circuit according to the embodiment.

FIG. 3 is a circuit diagram showing a configuration of a second charge pump of the phase-locked loop circuit according to the embodiment.

FIG. 4 is a circuit diagram showing a configuration of a low-pass filter of the phase-locked loop circuit according to the embodiment.

FIG. 5 is a circuit diagram showing a configuration of the voltage controlled oscillator of the phase-locked loop circuit according to the embodiment.

FIG. 6 is a circuit diagram showing a configuration of a voltage controlled oscillator of a phase-locked loop circuit according to prior art.

FIG. 9 is a circuit diagram showing a configuration of a charge pump and a low-pass filter of a phase-locked loop circuit according to prior art.

FIG. 11 is a circuit diagram showing a configuration of a voltage controlled oscillator of the phase-locked loop circuit according to the first modification.

DETAILED DESCRIPTION

Figure 7:
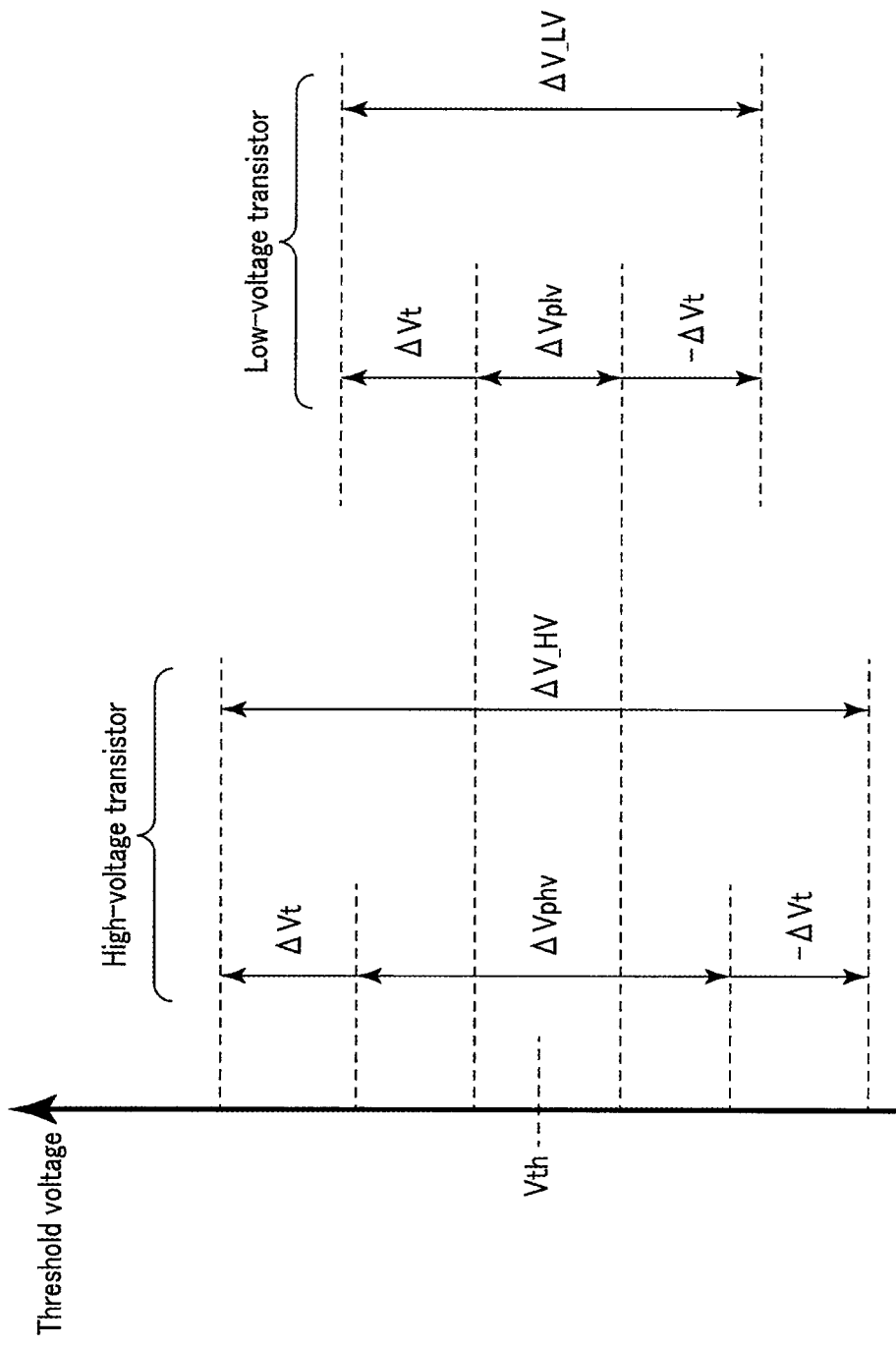
FIG. 7 is a diagram to explain effects of the phase-locked loop circuit according to the embodiment.

In general, according to one embodiment, a phase-locked loop circuit includes a low-pass filter including a first transistor, and a second transistor. The low-pass filter converts a first current into a first voltage, and a second current into a second voltage. The first current and the second current are generated in accordance with a pulse width of the same signal. In the first transistor, the first voltage is input to the gate, the first terminal is grounded, the second terminal is electrically coupled to the gate of the second transistor, and the gate oxide film is thicker than that of the second transistor. In the second transistor, the second voltage is input to the gate.

Hereinafter, embodiments will be described with reference to the accompanying drawings. In the description below, structural elements having substantially the same functions and configurations will be denoted by the same reference symbols, and a repetitive description of such elements will be given only where necessary. In the description below, the expression referring to an element being "coupled" to another element includes a situation where the elements are electrically connected, with a different element being interposed therebetween. The embodiments described below merely show an exemplary apparatus and method that implement the technical ideas of the embodiments. The technical ideas of the embodiments are not limited to the element materials, shapes, structures, arrangements, etc. described below. The technical ideas of the embodiments can be modified in various manners within the scope of the claims.

1. Embodiment

A phase-locked loop circuit according to an embodiment will be described.

1.1 Configuration 1.1.1 General Configuration

FIG. 1 is a block diagram showing a general configuration of a phase-locked loop circuit according to the embodiment.

As shown in FIG. 1, a phase-locked loop circuit 1 comprises a phase frequency detector (PFD) 1, a first charge pump (CP1) 20, a second charge pump (CP2) 30, a low-pass filter (LPF) 40, a voltage controlled oscillator (VCO) 50, and a divider (DIV) 60. The phase-locked loop circuit 1 outputs an output signal FOUT in response to an input signal FIN. The phase-locked loop 1 has a function of synchronizing a phase frequency of the input signal FIN with a phase frequency of the output signal FOUT. The input signal FIN and the output signal FOUT are, for example, pulse signals having a particular frequency.

In the phase frequency detector 10, the input signal FIN and the feedback signal FD are input, and a step-up signal UP and a step-down signal DN are output. The phase frequency detector 10 supplies the output step-up signal UP and step-down signal DN to the first charge pump 20 as well as to the second charge pump 30. The step-up signal UP and the step-down signal DN are a pulse signal having a pulse width which is determined in accordance with a phase difference between the input signal FIN and the feedback signal FD. Specifically, the phase frequency detector 10 outputs the step-up signal UP or the step-down signal DN during a period after a pulse of one of the input signal FIN and the feedback signal FD rises until a pulse of the other rises.

If the pulse rise of the input signal FIN is detected prior to the pulse rise of the feedback signal FD, for example, the phase frequency detector 10 determines that a frequency of the feedback signal FD is lower than a frequency of the input signal FIN, and outputs a step-up signal UP. Then, when the phase frequency detector 10 detects a pulse rise of the feedback signal FD after detecting a pulse rise of the input signal FIN, the phase frequency detector 10 stops outputting a step-up signal UP. Because of the operation in such a manner, if a frequency of the feedback signal FD is lower than a frequency of the input signal FIN, the phase frequency detector 10 continues outputting a step-up signal UP having a pulse width in accordance with a phase difference between the input signal FIN and the feedback signal FD.

Furthermore, if the pulse rise of the feedback signal FD is detected prior to the pulse rise of the input signal FIN, for example, the phase frequency detector 10 determines that a frequency of the feedback signal FD is higher than a frequency of the input signal FIN, and outputs a step-down signal DN. Then, when the phase frequency detector 10 detects a pulse rise of the input signal FIN after detecting the pulse rise of the feedback signal FD, the phase frequency detector 10 stops outputting a step-down signal DN. Because of the operation in such a manner, if a frequency of the feedback signal FD is higher than a frequency of the input signal FIN, the phase frequency detector 10 continues outputting a step-down signal DN having a pulse width in accordance with a phase difference between the input signal FIN and the feedback signal FD.

Not only the above-described example of comparing the pulse rise of two signals, but also various methods are applicable to the phase frequency detector 10.

Upon receiving a step-up signal UP or a step-down signal DN from the phase frequency detector 10, the first charge pump 20 supplies a current Icp1 to the low-pass filter 40 during a period corresponding to a pulse width of the step-up signal UP or the step-down signal DN. The direction in which the current Icp1 flows when a step-up signal UP is received is opposite to the direction when a step-down signal DN is received.

Upon receiving a step-up signal UP or a step-down signal DN from the phase frequency detector 10, the second charge pump 30 supplies a current Icp2 to the low-pass filter 40 during a period corresponding to a pulse width of the step-up signal UP or the step-down signal DN. The current Icp2 has a value of an amplitude different from that of the current Icp1. The current Icp2 is greater than the current Icp1, for example. The direction in which the current Icp2 flows when a step-up signal UP is received is opposite to the direction when a step-down signal DN is received.

The low-pass filter 40 charges and discharges an electric charge in accordance with a direction of the received current, and converts the received current into a DC voltage. The low-pass filter 40 transfers the converted voltage to the voltage controlled oscillator 50. Specifically, the low-pass filter 40 is supplied the current Icp1 from the first charge pump 20, and is supplied the current Icp2 from the second charge pump 30. The low-pass filter 40 transfers a voltage VCTRL to the voltage controlled oscillator 50 based on the current Icp1 and the current Icp2. The details of the configuration of the low-pass filter 40 will be described later.

The voltage controlled oscillator 50 outputs a signal having a different frequency in accordance with a magnitude of the received voltage. Specifically, when the voltage VCTRL is transferred from the low-pass filter 40, the voltage controlled oscillator 50 outputs an output signal FOUT based on the voltage VCTRL. The output signal FOUT is a pulse signal having a particular frequency, for example. The output signal FOUT is output to the divider 60 as well.

The divider 60 converts the received signal into a signal of a frequency divided by a particular value. Specifically, when the divider 60 receives an output signal FOUT, the divider 60 converts the output signal FOUT into a feedback signal FD of a frequency divided by N (N is a positive number). The divider 60 outputs a feedback signal FD to the phase frequency detector 10.

1.1.2 Configuration of Charge Pumps

Next, a configuration of charge pumps of the phase-locked loop circuit according to the embodiment will be described with reference to FIGS. 2 and 3. FIG. 2 is a circuit diagram showing a configuration of a first charge pump of the phase-locked loop circuit according to the embodiment. FIG. 3 is a circuit diagram showing a configuration of a second charge pump of the phase-locked loop circuit according to the embodiment.

As shown in FIG. 2, the first charge pump 20 is a current-charging type charge pump which outputs a current Icp1 for charging and discharging an electric charge in a following low-pass filter 40. The first charge pump 20 includes the constant current sources 21 and 23 and switches 22 and 24.

One terminal of the constant current source 21 is coupled to a voltage VDD, and the other terminal is coupled to one terminal of the switch 22. The constant current source 21 has a capability of supplying a current Icp1 from the voltage VDD to the switch 22. The voltage VDD is driven by a low-voltage power supply of 1V or less, for example.

One terminal of the switch 22 is coupled to the other terminal of the constant current source 21, and the other terminal is coupled to a node N1. The switch 22 is in an ON state during a period when a step-down signal DN is being input, and transfers a current Icp1 supplied from the constant current source 21 to the low-pass filter 40 via the node N1. The switch 22 is in an OFF state during a period when no step-down signal DN is input, and the node N1 is cut off from the voltage VDD.

One terminal of the constant current source 23 is coupled to a voltage VSS, and the other terminal is coupled to one terminal of the switch 24. The voltage VSS is, for example, 0V. The constant current source 23 has a capability of supplying a current Icp1 from the voltage VSS to the switch 24.

One terminal of the switch 24 is coupled to the other terminal of the constant current source 23, and the other terminal is coupled to a node N1. The switch 24 is in an ON state during a period when a step-up signal UP is being input, and transfers a current Icp1 supplied from the constant current source 23 to the low-pass filter 40 via the node N1. The switch 24 is in an OFF state during a period when no step-up signal UP is input, and the node N1 is cut off from the voltage VSS.

Because of this configuration, the current Icp1 flows between the first charge pump 20 and the low-pass filter 40 in an opposite direction during a period when a step-up signal UP is being input and during a period when a step-down signal DN is being input. Both of the switch 22 and the switch 24 are in an OFF state during a period when none of the step-up signal UP and the step-down signal DN are input. Thus, the node N1 is cut off from both of the voltage VDD and the voltage VSS during a period when none of the step-up signal UP and the step-down signal DN are input.

As shown in FIG. 3, the second charge pump 30 is, for example, a current-charging type charge pump which outputs a current Icp2 for charging and discharging an electric charge in the following low-pass filter 40. The second charge pump 30 has the same configuration as that of the first charge pump 20, for example. Specifically, the second charge pump 30 includes constant current sources 31 and 33 and switches 32 and 34.

One terminal of the constant current source 31 is coupled to a voltage VDD, and the other terminal is coupled to one terminal of the switch 32. The constant current source 31 has a capability of supplying a current Icp2 from the voltage VDD to the switch 32.

One terminal of the switch 32 is coupled to the other terminal of the constant current source 31, and the other terminal is coupled to a node N2. The switch 32 is in an ON state during a period when a step-down signal DN is being input, and transfers a current Icp2 supplied from the constant current source 31 to the low-pass filter 40 via the node N2. The switch 32 is in an OFF state during a period when no step-down signal DN is input, and the node N2 is cut off from the voltage VDD.

One terminal of the constant current source 33 is coupled to a voltage VSS, and the other terminal is coupled to one terminal of the switch 34. The constant current source 33 has a capability of supplying a current Icp2 from the voltage VSS to the switch 34.

One terminal of the switch 34 is coupled to the other terminal of the constant current source 33, and the other terminal is coupled to a node N2. The switch 34 is in an ON state during a period when a step-up signal UP is being input, and transfers a current Icp2 supplied from the constant current source 33 to the low-pass filter 40 via the node N2. The switch 34 is in an OFF state during a period when no step-up signal UP is input, and the node N2 is cut off from the voltage VSS.

Because of this configuration, the current Icp2 flows between the second charge pump 30 and the low-pass filter 40 in an opposite direction during a period when a step-up signal UP is being input and during a period when a step-down signal DN is being input. Both of the switch 32 and the switch 34 are in an OFF state during a period when none of the step-up signal UP and the step-down signal DN are input. Thus, the node N2 is cut off from both of the voltage VDD and the voltage VSS during a period when none of the step-up signal UP and the step-down signal DN are input.

Each of the first charge pump 20 and the second charge pump 30 synchronizes the current Icp1 and the current Icp2 with each other and supplies the current to the low-pass filter 40. Thus, it is desirable to simultaneously input the same step-up signal UP or step-down signal DN from the phase frequency detector 10 to the first charge pump 20 and the second charge pump 30.

1.1.3 Configuration of Low-pass Filter

Next, a configuration of a low-pass filter of the phase-locked loop circuit according to the embodiment will be described with reference to FIG. 4. FIG. 4 is a circuit diagram showing a configuration of a low-pass filter of the phase-locked loop circuit according to the embodiment. As shown in FIG. 4, the low-pass filter 40 converts the current Icp1 supplied from the first charge pump 20 into a voltage VINT, and the current Icp2 supplied from the second charge pump 30 into a voltage VCTRL. The voltage VCTRL is transferred to the voltage controlled oscillator 50 from the node N2 as an output terminal. The low-pass filter 40 includes a first capacitor 41, a second capacitor 42, a resistor 43, and a buffer circuit 70.

One terminal of the first capacitor 41 is coupled to the node N1, and the other terminal is coupled to the voltage VSS. When a current Icp1 flows from the first charge pump 20 toward the low-pass filter 40, for example, the first capacitor 41 charges an electric charge, and when a current Icp1 flows from the low-pass filter 40 toward the first charge pump 20, the first capacitor 41 discharges the electric charge. The voltage of the node N1 becomes a voltage VINT by charging and discharging at the first capacitor 41.

The buffer circuit 70 is a buffer amplifier circuit in which the input terminal thereof is coupled to the node N1 and the output terminal thereof is coupled to the node N3. The buffer circuit 70 has an output impedance smaller than at least an output impedance of the second charge pump 30 in a state when a current Icp2 is not supplied from the second charge pump 30. The buffer circuit 70 has a gain G and outputs a voltage VINTD to the node N3, for example. The gain G indicates a ratio of the voltage VINTD to the voltage VINT, and, for example, 0 dB is applied. Not only 0 dB, but an arbitrary value may be applicable for the gain G. The buffer circuit 70 includes, for example, a transistor 44 and a constant current source 45.

The transistor 44 is a MOS (metal oxide semiconductor) transistor having an n-channel polarity, for example (hereinafter, referred to as "n-channel transistor"). In the transistor 44, the gate is coupled to the node N1, one terminal is coupled to the voltage VDD, and the other terminal is coupled to the node N3. One terminal of the constant current source 45 is coupled to the node N3, and the other terminal is coupled to the voltage VSS. Because of such a configuration, the buffer circuit 70 has a function as a source-follower circuit.

The node N1 is cut off from the voltage VDD and the voltage VSS in the first charge pump 20, as described above, during a period in which the current Icp1 is not supplied from the first charge pump 20. For this reason, the node N1 is in a high-impedance state during a period when the current Icp1 is not supplied from the first charge pump 20. In other words, if an unintended current flows in the node N1 during a period when the current Icp1 is not supplied from the first charge pump 20, the voltage VINT may fluctuate. An unintended current is, for example, a leak current (a gate leak current) flowing between a gate and a channel of the transistor 44. Specifically, if the transistor 44 is an n-channel transistor, a gate leak current may flow from the gate to the channel. In other words, the gate leak current may cause decline of the voltage VINT. Since the fluctuation in the voltage VINT which occurs in such a manner may be a cause of jitter of the output signal FOUT, it is desirable to prevent the fluctuation. In other words, it is desirable to configure the transistor 44 to prevent generation of a gate leak current.

The transistor 44 has a gate oxide film having a thickness to such an extent that a gate leak current is ignorable. An ignorable gate leak current of the transistor 44 means that fluctuation in the voltage VINT caused by a gate leak current can be ignored. In the following description, a transistor having a gate oxide film of a thickness to such an extent that a gate leak current is ignorable will be referred to as a high-voltage transistor. A gate oxide film used for a high-voltage transistor has a thickness to such an extent that the film cannot be broken even when an input/output end voltage of the semiconductor chip is applied. As an input/output end voltage of the semiconductor chip, a voltage of 1.8V or 2.5V is used, for example.

One terminal of the second capacitor 42 is coupled to the node N2, and the other terminal is coupled to the voltage VSS. When a current Icp2 flows from the second charge pump 30 toward the low-pass filter 40, the second capacitor 42 charges an electric charge, and when a current Icp2 flows from the low-pass filter 40 toward the second charge pump 30, the second capacitor 42 discharges the electric charge.

One terminal of the resistor 43 is coupled to the node N3, and the other terminal is coupled to the node N2. The voltage of the node N2 becomes a voltage VCTRL by charging/discharging of the first capacitor 41 and the second capacitor 42, and by a current flowing from the node N3, which is the output terminal of the buffer circuit 70, to the resistor 43.

Because of this configuration, the node N2, which is the output terminal of the low-pass filter 40, is coupled to the node N3, which is the output terminal of the buffer circuit 70. Thus, although the node N2 is being cut off from the voltage VDD and the voltage VSS in the second charge pump 30, the node N2 will not be in a high-impedance state even during a period when no current Icp2 is supplied from the second charge pump 30.

1.1.4 Configuration of Voltage Controlled Oscillator

Next, a configuration of the voltage controlled oscillator of the phase-locked loop circuit according to the embodiment will be described with reference to FIG. 5. FIG. 5 is a circuit diagram showing a configuration of the voltage controlled oscillator of the phase-locked loop circuit according to the embodiment. As shown in FIG. 5, the voltage controlled oscillator 50 includes the transistor 51 and the oscillator 52.

The transistor 51 has a function as a voltage-current converter which supplies a current of an amplitude corresponding to a value of a voltage VCTRL to the oscillator 52. The transistor 51 is, for example, an MOS transistor having a polarity of p-channel (hereinafter, referred to as "p-channel transistor"). In the transistor 51, the gate is coupled to the node N2, one terminal is coupled to the voltage VDD, and the other terminal is coupled to a first terminal of the oscillator 52.

The transistor 51 has a gate oxide film that is thinner than that of the transistor 44. In other words, a gate leak current flows in the transistor 51 to such an extent that the gate leak current cannot be ignored. In a case where the transistor 51 is a p-channel transistor, the gate leak current may flow from the channel to the gate. In other words, the gate leak current may cause an increase of the voltage VCTRL. In the following description, a transistor having a thin gate oxide film to such an extent that the influence of the gate leak current cannot be ignored will be referred to as "a low-voltage transistor" in order to distinguish such a transistor from a high-voltage transistor. The gate oxide film used for a low-voltage transistor has a thickness to such an extent that the transistor would not be broken even when an inner voltage of a semiconductor chip is applied to the transistor. A voltage of more or less than 1.0V is used for the inner voltage of the semiconductor chip, for example.

The oscillator 52 has a function as a current controlled oscillator which outputs a signal of a frequency in accordance with a value of a current supplied from the other terminal of the transistor 51. A first terminal of the oscillator 52 is coupled to the other terminal of the transistor 51, a second terminal is coupled to the voltage VSS, and the oscillator 52 outputs the output signal FOUT from a third terminal.

Such a configuration allows the oscillator 52 to be supplied with a current from the other terminal of the transistor 51 during a period when the transistor 51 is in an ON state. The transistor 51 and the oscillator 52 change the frequency of the output signal FOUT in accordance with the magnitude of the voltage VCTRL.

1.2 Advantageous Effects of Present Embodiment

Unintended fluctuation in the voltage VCTRL which is input to the voltage controlled oscillator causes fluctuation in the frequency of the output signal FOUT and jitter (fluctuation in cycles). Since jitter deteriorates timing margin, etc., it is desirable to suppress jitter. In other words, it is desirable to suppress unintended fluctuation in the voltage VCTRL.

FIG. 6 is a circuit diagram showing a configuration of a voltage controlled oscillator of a phase-locked loop circuit according to prior art. As shown in FIG. 6, the voltage controlled oscillator 100 includes the transistor 101 and the oscillator 102. Similarly to the voltage controlled oscillator 50, the voltage controlled oscillator 100 is supplied with the voltage VCTRL, and outputs the output signal FOUT.

A description of the oscillator 102 is omitted as it has a configuration similar to that of the oscillator 52 shown in FIG. 5.

The transistor 101 has a gate oxide film thicker than that of the transistor 51 shown in FIG. 5. In other words, the gate leak current generated in the transistor 101 is suppressed to such an extent that the gate leak current can be ignored. Thus, the input voltage to the gate caused by the gate leak current in the transistor 101 hardly fluctuates, and the voltage VCTRL therefore hardly fluctuates in the voltage controlled oscillator 100 of prior art. As described above, the voltage controlled oscillator 100 according to prior art has the high-voltage transistor 101 to suppress generation of a gate leak current, and by extension, to suppress fluctuation in a voltage VCTRL.

However, a high-voltage transistor in general tends to have larger variations in threshold voltage from a designed threshold value, in comparison to a low-voltage transistor. FIG. 7 is a diagram showing the degree of variations in a threshold voltage of a high-voltage transistor and in a threshold voltage of a low-voltage transistor. FIG. 7 shows variations caused by manufacturing error and variations caused by variations in operation temperature, as factors that may be a main cause for the variations in threshold voltage. As shown in FIG. 7, the threshold voltage of a transistor is designed to be a particular voltage Vth; however, there may be a variation in threshold voltage caused by some factors.

Specifically, in a high-voltage transistor, manufacturing errors, for example, cause variations in threshold voltage within the range of the value $\Delta V phv$ around the voltage Vth. In a high-voltage transistor, temperature variations, for example, cause the threshold voltage to vary by the value $\Delta Vt$. Therefore, a threshold voltage of a high-voltage transistor which is supposed to have a threshold voltage of Vth would vary within the range $\Delta V\_HV = \Delta V phv + 2 \times \Delta Vt$.

On the other hand, in a low-voltage transistor, manufacturing errors, for example, causes variations in threshold voltage within the range of the value $\Delta V plv$ around the voltage Vth. In a low-voltage transistor, temperature variations, for example, cause the threshold voltage to vary by the value $\Delta Vt$. Herein, the value $\Delta V plv$ is smaller than the value $\Delta V phv$. Whether a low-voltage or high-voltage, the amount of fluctuation in a threshold voltage caused by temperature variations basically does not change. Accordingly, a threshold voltage of a low-voltage transistor which is supposed to have a threshold voltage of Vth would vary within the range $\Delta V\_LV = \Delta V plv + 2 \times \Delta Vt$. Consequently, variations in threshold voltage in a high-voltage transistor would be greater than in a low-voltage transistor by the value $\Delta V\_HV - \Delta V\_LV$ (>0).

The transistor 51 having a different threshold voltage is to supply the oscillator 52 with a different current for a particular voltage VCTRL of the same magnitude. As a result, the oscillator 52 outputs an output signal FOUT of a different frequency for the particular voltage VCTRL of the same magnitude. In other words, variations in threshold voltage of the transistor 51 affect the frequency of the output signal FOUT. For this reason, when manufacturing a phase-locked loop circuit, the larger the variation of the threshold voltage will be, the narrower the frequency range that can guarantee oscillation will become. In other words, there is room in prior art for consideration regarding suppressing generation of jitter caused by a gate leak current while providing a wider frequency range that allows oscillation.

In the embodiment, the transistor 51 is a low-voltage transistor. Thus, variation in threshold voltage of the transistor 51 will be smaller in comparison to the case of a high-voltage transistor (e.g., the transistor 101). Thus, the voltage controlled oscillator 50 can guarantee oscillating an output signal FOUT in a wider range of frequency.

As described above, a gate leak current cannot be ignored in the low-voltage transistor 51. Since output impedance of the second charge pump 30 in a state where no current Icp2 is supplied is high, the magnitude of the voltage VCTRL may fluctuate if an amplitude of the gate leak current cannot be ignored. Accordingly, in the embodiment, the low-pass filter 40 includes a buffer circuit 70. Furthermore, the node N2 is coupled to the node N3 which is an output terminal of the buffer circuit 70. The node N1 which is an input terminal of the buffer circuit 70 is supplied with a voltage VINT. Thus, the voltage VINTD output from the node N3 is maintained by the voltage VINT. For this reason, the node N2 will not be in a high-impedance state even during a period when no current Icp2 is supplied from the second charge pump 30 to the low-pass filter 40. Thus, even in a case where a gate leak current is generated in the transistor 51 during a period when no current Icp2 is supplied to the low-pass filter 40, the fluctuation in the voltage VCTRL to be transferred to the voltage controlled oscillator 50 can be suppressed. Thus, it is possible to reserve a frequency range which allows an output signal FOUT to oscillate.

Furthermore, in the first aspect of the embodiment, the gate oxide film of the transistor 44 is to be thicker than the gate oxide film of the transistor 51. Thus, it is possible to suppress the generation of a gate leak current in the transistor 44. For this reason, it is possible to suppress the fluctuation in the voltage VINT caused by a gate leak current even when the transistor 44 is coupled to the first charge pump 20 having a high output impedance at the gate. The suppressing of the fluctuation in the voltage VINT can suppress the fluctuation in the voltage VINTD, the suppressing of the fluctuation in the voltage VINTD can suppress the fluctuation in the voltage VCTRL, and the suppressing of the fluctuation in the voltage VCTRL can further suppress the generation of the jitter of an output signal FOUT.

In the second aspect of the embodiment, the buffer circuit 70 is a source-follower circuit. Thus, the buffer circuit 70 can have a simpler circuit configuration consisting of a transistor 44 and a constant current source 45. Thus, it is possible to prevent a complicated design with a larger number of elements and an increase of overall surface area.

Figure 8:
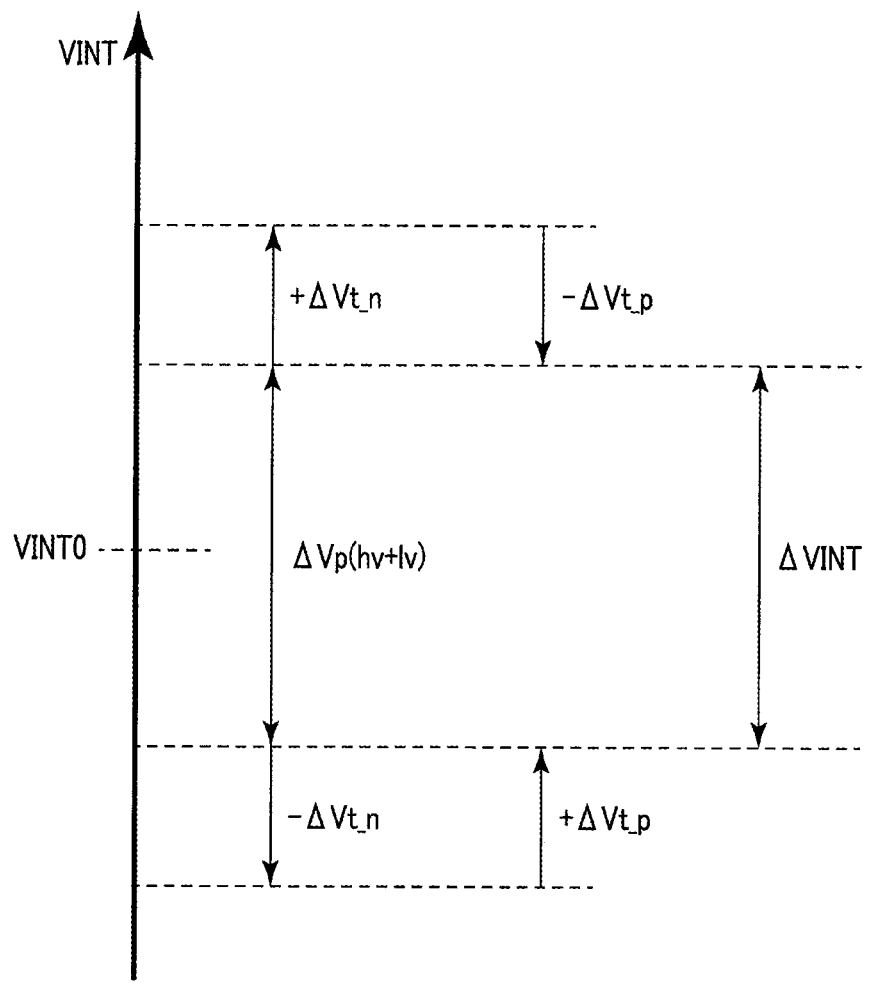
FIG. 8 is a diagram to explain effects of the phase-locked loop circuit according to the embodiment.

Furthermore, in the third aspect of the embodiment, the transistor 44 and the transistor 51 have opposite polarities. Specifically, the transistor 44 is an n-channel transistor, and the transistor 51 is a p-channel transistor. FIG. 8 is a diagram to describe effects of the embodiment. FIG. 8 typically shows how the variation in threshold voltage of the transistors 44 and 51 affects the magnitude of the voltage VINT. Specifically, FIG. 8 typically shows how the variation in the magnitude of the voltage VINT is suppressed when the transistors 44 and 51 have opposite polarities.

As shown in FIG. 8, the voltage VINT is designed to become a voltage VINT0 if the phase-locked loop circuit 1 is in a locked state under certain conditions. However, the voltage VINT that actually locks the phase-locked loop circuit 1 may fluctuate from the voltage VINT0 within a particular range of $\Delta$VINT caused by variations in threshold voltage of the transistors 44 and 51 caused by manufacturing errors and temperature variations.

Specifically, the voltage VINT fluctuates only by the range $\Delta$Vp (hv+lv) by variations in threshold voltage caused by manufacturing errors in the transistors 44 and 51. The range $\Delta$Vp (hv+lv) is a range of variations applied to the voltage VINT as a whole by the fluctuation value $\Delta$Vphv of the threshold voltage caused by manufacturing errors in the high-voltage transistor 44 and the fluctuation value $\Delta$Vplv of the threshold voltage caused by manufacturing errors in the low-voltage transistor 51.

The drain current of the transistor 51 at the time when the phase-locked loop circuit 1 is locked is dependent on the voltage VCTRL of the gate of the transistor 51. The voltage VCTRL is dependent on the voltage VINTD, and the voltage VINTD is dependent on the voltage VINT through the transistor 44. For this reason, the voltage VINT fluctuates because of variations in the threshold voltage caused by the temperature variations in the transistors 44 and 51. The details are as described below.

The voltage VINT fluctuates only by the value $\Delta$Vt_n because of variations in threshold voltage caused by temperature variations in the transistor 44. Specifically, since the transistor 44 is an n-channel transistor, the threshold voltage rises when the temperature declines, and the voltage VINT rises (in FIG. 8, shown as the value+$\Delta$Vt_n). Moreover, in the transistor 44, the threshold voltage declines when the temperature rises, and the voltage VINT declines (in FIG. 8, shown as the value −$\Delta$Vt_n).

On the other hand, the voltage VINT only fluctuates by the value $\Delta$Vt_p because of variations in threshold voltage caused by temperature variations in the transistor 51. Specifically, since the transistor 51 is a p-channel transistor, the threshold voltage rises when the temperature decreases, and the voltage VCTRL rises. Along with this, the voltage VINT declines (shown as the value −$\Delta$Vt_p). Moreover, in the transistor 51, the threshold voltage declines when the temperature rises, and the voltage VCTRL rises. Along with this, the voltage VINT rises (shown as the value+$\Delta$Vt_p).

Thus, the value $\Delta$Vt_n and the value $\Delta$Vt_p affect each other in opposite directions, and the range $\Delta$VINT in which the voltage VINT eventually fluctuates is suppressed for a value corresponding to temperature change. Thus, it is possible to achieve a wider operation range of the voltage VINT. FIG. 8 shows a case where the value $\Delta$Vt_n and the value $\Delta$Vt_p are equal but not limited thereto; the values may be different.

Furthermore, in the fourth aspect of the embodiment, each of the current Icp1 and the current Icp2 is supplied to the low-pass filter 40 respectively from the first charge pump 20 and the second charge pump 30. Effects of the fourth aspect of the embodiment are described with reference to FIG. 9.

FIG. 9 is a circuit diagram showing a configuration of a charge pump and a low-pass filter of a phase-locked loop circuit according to prior art. The charge pump and the low-pass filter shown in FIG. 9 are coupled to, for example, the voltage controlled oscillator 100 shown in FIG. 6. As shown in FIG. 9, in the phase-locked loop circuit according to prior art, only a current Icp0 is supplied from one charge pump 200 to the low-pass filter 300, for example.

The charge pump 200 includes constant current sources 201 and 203 and switches 202 and 204, for example. One terminal of the constant current source 201 is coupled to a voltage VDD, and the other terminal is coupled to one terminal of the switch 202. The constant current source 201 has a capability of supplying a current Icp0 from the voltage VDD to the switch 202.

One terminal of the switch 202 is coupled to the other terminal of the constant current source 201, and the other terminal is coupled to a node N10. The switch 202 is in an ON state during a period when a step-down signal DN is being input, and transfers a current Icp0 supplied from the constant current source 201 to the low-pass filter 300 via the node N10. The switch 202 is in an OFF state during a period when no step-down signal DN is input, and the node N10 is cut off from the voltage VDD.

One terminal of the constant current source 203 is coupled to a voltage VSS, and the other terminal is coupled to one terminal of the switch 204. The constant current source 203 has a capability of supplying a current Icp0 from the voltage VSS to the switch 204.

One terminal of the switch 204 is coupled to the other terminal of the constant current source 203, and the other terminal is coupled to a node N10. The switch 204 is in an ON state during a period when a step-up signal UP is being input, and transfers a current Icp0 supplied from the constant current source 203 to the low-pass filter 40 via the node N10. The switch 204 is in an OFF state during a period when no step-up signal UP is input, and the node N10 is cut off from the voltage VSS.

Because of this configuration, the current Icp0 flows between the charge pump 200 and the low-pass filter 300 in an opposite direction during a period when a step-up signal UP is being input and during a period when a step-down signal DN is being input. Both of the switch 202 and the switch 204 are in an OFF state during a period when none of the step-up signal UP and the step-down signal DN are input. Thus, the node N10 is cut off from both of the voltage VDD and the voltage VSS during a period when none of the step-up signal UP and the step-down signal DN are input.

The low-pass filter 300 converts the current Icp0 supplied from the charge pump 200 into a voltage VCTRL. The low-pass filter 300 includes a first capacitor 301, a resistor 302, and a second capacitor 303. One terminal of the first capacitor 301 is coupled to one terminal of a voltage VSS, and the other terminal is coupled to one terminal of the resistor 302. One terminal of the resistor 302 is coupled to the other terminal of the first capacitor 301, and the other terminal is coupled to the node N10. One terminal of the second capacitor 303 is coupled to one terminal of a voltage VSS, and the other terminal is coupled to one terminal of the node N10.

The characteristics of the charge pump 200 and the low-pass filter 300 configured as described above can be described as shown below using a transfer function $H_0(s)$ to which a Laplace transform is applied.

$$H_0(s) = \left[\frac{V_{CTRL}}{I_{cp0}}\right](s) = \frac{1 + sR_0 C_{10}}{s(C_{10} + C_{20})\left[1 + sR_0 \frac{C_{10} C_{20}}{C_{10} + C_{20}}\right]}$$

Herein, $R_0$ represents a resistance of the resistor 302, $C_{10}$ represents a capacitance of the first capacitor 301, and $C_{20}$ represents a capacitance of the second capacitor 303.

If $C_{10} \gg C_{20}$, an approximation of the above expression is as follows.

$$H_0(s) \approx \frac{1 + sR_0 C_{10}}{sC_{10}[1 + sR_0 C_{20}]}$$

On the other hand, suppose if the gain G of the buffer circuit 70 is 0 dB and the output impedance is sufficiently smaller than R, the characteristics of the first charge pump 20, the second charge pump 30, and the low-pass filter 40 according to the embodiment can be described as shown below using a transfer function $H_1(s)$.

$$H_1(s) = \left[\frac{V_{CTRL}}{I_{cp2}}\right](s) \approx \frac{1 + sR\frac{I_{cp2}}{I_{cp1}}C_1}{s\frac{I_{cp2}}{I_{cp1}}C_1[1 + sRC_2]}$$

Herein, R is a resistance of the resistor 43, $C_1$ is a capacitance of the first capacitor 41, and $C_2$ is a capacitance of the second capacitor 42.

If $R=R_0$, $C_2=C_{20}$, and $C_1=C_{10}/10$, for example, the transfer function $H_1(s)$ becomes equal to $H_0(s)$ when Icp/Icp1=10. The capacitance is proportional to an area of the capacitor. In other words, according to the fourth aspect of the embodiment, by appropriately setting a ratio of the current Icp2 and the current Icp2, it is possible to obtain a transfer function having characteristics equivalent to those of the charge pump 200 and the low-pass filter 300 according to prior art while reducing the area of the first capacitor 41.

Not only can the transfer function $H_1(s)$ reduce the capacitance $C_1$ in comparison to the capacitance $C_{10}$, but can also design a combination of the resistance R, the capacitance $C_1$, and the capacitance $C_2$ more freely than in prior art for a combination of the resistance R, the capacitance $C_{10}$, and the capacitance $C_{20}$. Thus, it is possible to increase ease-of-design for reducing jitter and circuit area of the phase-locked loop circuit 1.

2. Other Variation Examples

The embodiments are not limited to the embodiment described above but can be modified in various ways. Each modification will be described below only for the matters different from the embodiment.

2.1 First Variation Example

The transistor 44 of the phase-locked loop circuit according to the embodiment was described as an n-channel transistor, and the transistor 51 as a p-channel transistor; however, the transistors are not limited thereto. For example, the transistor 44 may be a p-channel transistor, and the transistor 51 may be an n-channel transistor.

Figure 10:
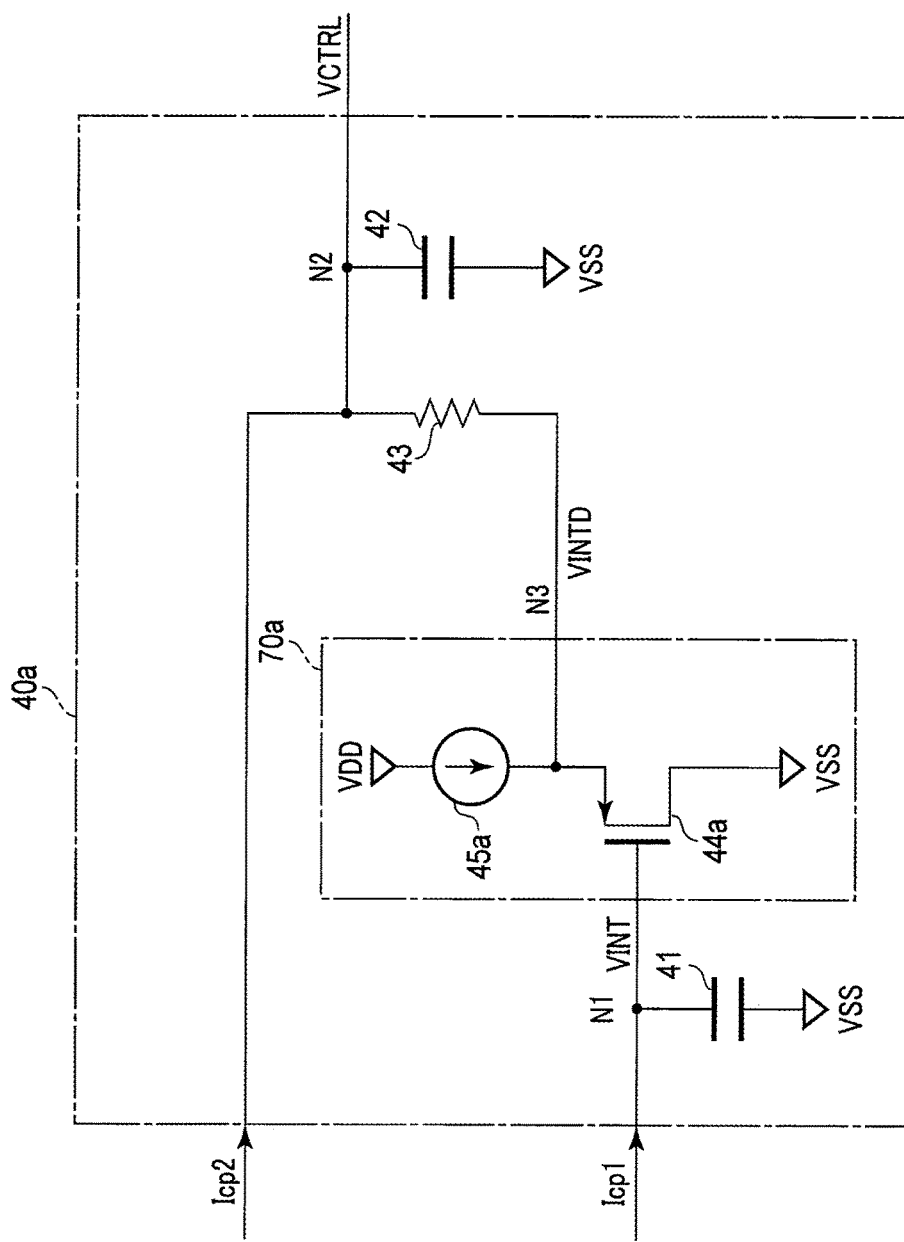
FIG. 10 is a circuit diagram showing a configuration of a low-pass filter of a phase-locked loop circuit according to the first modification.

FIG. 10 is a circuit diagram showing a configuration of a low-pass filter of a phase-locked loop circuit according to the first modification. The low-pass filter 40a includes a buffer circuit 70a as shown in FIG. 10. The buffer circuit 70a includes a transistor 44a and a constant current source 45a.

The transistor 44a is a high-voltage p-channel transistor, for example. In the transistor 44, the gate is coupled to the node N1, one terminal is coupled to the voltage VSS, and the other terminal is coupled to the node N3. One terminal of the constant current source 45 is coupled to the node N3, and the other terminal is coupled to the voltage VDD.

Because of such a configuration, in the phase-locked loop circuit according to the first modification, the buffer circuit 70a can have a function as a source-follower circuit like the buffer circuit 70, even in a case where a p-channel transistor 44a is adopted.

FIG. 11 is a circuit diagram showing a configuration of a voltage controlled oscillator of the phase-locked loop circuit according to the first modification. The voltage controlled oscillator 50a includes a transistor 51a and an oscillator 52a, as shown in FIG. 11.

The transistor 51a is a low-voltage n-channel transistor, for example. In the transistor 51a, the gate is coupled to the node N2, one terminal is coupled to the voltage VSS, and the other terminal is coupled to a first terminal of the oscillator 52a. A first terminal of the oscillator 52 is coupled to the other terminal of the transistor 51, a second terminal is coupled to the voltage. VDD, and the oscillator 52 outputs the output signal FOUT from a third terminal.

Because of such a configuration, in the phase-locked loop circuit according to the first modification, the voltage controlled oscillator 50a can vary the frequency of the output signal FOUT in accordance with the magnitude of the voltage VCTRL, like the voltage controlled oscillator 50, even in a case where a n-channel transistor 51a is adopted. Note that the phase-locked loop circuit according to the first modification can achieve an effect similar to the effect of the embodiment.

2.2. Second Variation Example

The buffer circuit according to the embodiment was described as a source-follower circuit; however, it is not limited thereto. The buffer circuit 70 may be a unity gain buffer circuit using an operational amplifier (OP), for example.

Figure 12:
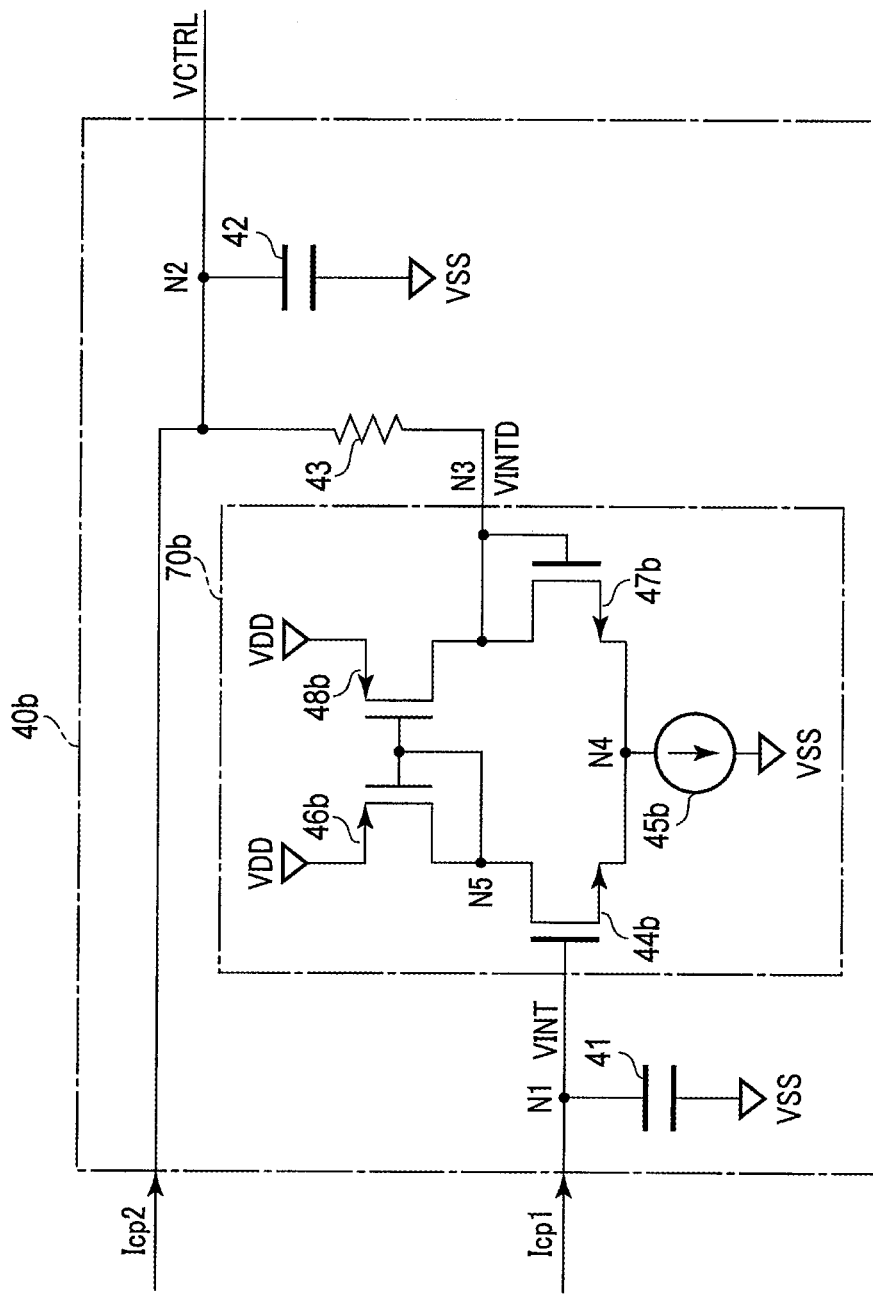
FIG. 12 is a circuit diagram showing a configuration of a low-pass filter of the phase-locked loop circuit according to the second modification.

FIG. 12 is a circuit diagram showing a configuration of a low-pass filter of the phase-locked loop circuit according to the second modification. As shown in FIG. 12, the low-pass filter 40b includes the buffer circuit 70b. The buffer circuit 70b includes the transistors 44b and 46b to 48b, and a constant current source 45b.

The transistor 44b is a high-voltage n-channel transistor, for example. In the transistor 44b, the gate is coupled to the node N1, one terminal is coupled to the node N5, and the other terminal is coupled to the node N4.

One terminal of the constant current source 45b is coupled to a voltage VSS, and the other terminal is coupled to the node N4.

The transistor 46b is a low-voltage p-channel transistor, for example. One terminal of the transistor 46b is coupled to a voltage VDD, and the other terminal and the gate are coupled to the node N5.

The transistor 47b is a high-voltage n-channel transistor, for example. In the transistor 47b, the gate and one terminal are coupled to the node N3, and the other terminal is coupled to the node N4.

The transistor 48a is a low-voltage p-channel transistor, for example. In the transistor 48b, one terminal is coupled to the voltage VDD, the gate is coupled to the node N5, and the other terminal is coupled to the node N3.

In the phase-locked loop circuit according to the second modification, a voltage VINT, a voltage VINTD and a voltage VCTRL become equal because of the above-described configuration, using the buffer circuit 70b wherein an OP amplifier is adopted. Thus, it is possible to suppress the fluctuation range of the threshold voltage of the voltage VINT to the same extent as the fluctuation in the threshold voltage in the low-voltage transistor shown in FIG. 7, and furthermore, to widen the frequency range in which the voltage controlled oscillator 50 can operate.

2.3 Third Variation Example

For the high-voltage transistor 44, not only an enhancement type but also a depletion type may be used. If a depletion type is adopted, the transistor 44 is capable of outputting a voltage VINTD to the node N3 even in a case where a voltage VINT to be supplied to the node N1 is 0V.

Generally, it is assumed that a high-voltage transistor is operated at a power source voltage of 1.8V or 2.5V; thus, a high-voltage transistor has a high threshold voltage. Thus, there may be a necessity of driving the phase-locked loop circuit 1 by a high power source voltage in order to supply a high voltage to the node N1. In the phase-locked loop circuit according to the third modification, if a depletion type is adopted, the high-voltage transistor 44 can be driven by a lower power source voltage. The phase-locked loop circuit according to the third modification can achieve an effect similar to the effect of the embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the invention.

What is claimed is:
1. A phase-locked loop circuit comprising:
a low-pass filter which converts a first current into a first voltage and a second current into a second voltage, and which includes a first transistor, the first current and the second current being generated in accordance with a pulse width of a same signal; and
a second transistor including a gate input with the second voltage,
wherein the first voltage is input to a gate of the first transistor, a first terminal of the first transistor is grounded, a second terminal of the first transistor is electrically coupled to the gate of the second transistor, and a gate oxide film of the first transistor is thicker than that of the second transistor.

2. The circuit according to claim 1, wherein the first transistor includes a high-voltage transistor, and the second transistor includes a low-voltage transistor.

3. The circuit according to claim 1, wherein the first transistor and the second transistor have opposite polarities.

4. The circuit according to claim 1, wherein the first transistor includes an n-channel transistor, and the second transistor includes a p-channel transistor.

5. The circuit according to claim 1, wherein the first transistor includes a p-channel transistor, and the second transistor includes an n-channel transistor.

6. The circuit according to claim 1, wherein the low-pass filter includes a buffer circuit, and the buffer circuit includes the first transistor.

7. The circuit according to claim 6, wherein the buffer circuit includes a source-follower circuit.

8. The circuit according to claim 6, wherein the buffer circuit includes a unity-gain buffer circuit.

9. The circuit according to claim 1, wherein the low-pass filter further includes
- a first capacitor in which a first terminal is electrically coupled to the gate of the first transistor and a second terminal is grounded,
- a resistor in which a first terminal is electrically coupled to the second terminal of the first transistor and a second terminal is electrically coupled to the gate of the second transistor, and
- a second capacitor in which a first terminal is electrically coupled to the gate of the second transistor and the second terminal of the resistor, and a second terminal is grounded.

10. The circuit according to claim 1, wherein the first current and the second current are generated in mutual synchronization.

11. The circuit according to claim 1, wherein the first current is smaller than the second current.

12. The circuit according to claim 9, wherein a capacitance of the first capacitor is larger than a capacitance of the second capacitor.

13. The circuit according to claim 1, wherein the first transistor includes a depletion-type transistor.

14. The circuit according to claim 1, wherein the first terminal of the first transistor is grounded to a power source voltage.

* * * * *